United States Patent
Hsu et al.

(10) Patent No.: US 6,194,310 B1
(45) Date of Patent: Feb. 27, 2001

(54) METHOD OF FORMING AMORPHOUS CONDUCTING DIFFUSION BARRIERS

(75) Inventors: Sheng Teng Hsu; Douglas James Tweet, both of Camas; Wei Pan, Vancouver, all of WA (US); David Russell Evans, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/585,680

(22) Filed: Jun. 1, 2000

(51) Int. Cl.$^7$ ................................................ H01L 21/4763
(52) U.S. Cl. ......................... 438/643; 438/653; 438/680; 438/685
(58) Field of Search .................................... 438/643, 653, 438/680, 685

(56) References Cited

U.S. PATENT DOCUMENTS

| | | | |
|---|---|---|---|
| 5,552,341 | * 9/1996 | Lee ........................................ | 438/643 |
| 5,843,842 | * 12/1998 | Lee et al. .............................. | 438/680 |
| 5,899,740 | * 5/1999 | Kwon ..................................... | 438/643 |
| 5,939,787 | * 8/1999 | Lee ........................................ | 257/740 |
| 5,942,799 | 8/1999 | Danek et al. ........................ | 257/751 |
| 6,066,554 | * 5/2000 | Kim et al. ............................ | 438/653 |
| 6,096,640 | * 8/2000 | Hu ........................................ | 438/653 |

OTHER PUBLICATIONS

Article entitled, "CVD TiN and Hybrid Barriers for Back-end Copper Interconnect Technology", by A. Jain, et al., Conference Proceedings ULSI XIII, 1998 Materials Research Society, pp. 41–47.

Article entitled, "CVD Copper Barriers" by Timothy E. Levine, et al., Conference Proceedings ULSi XIII, 1998 Materials Research Society, pp. 95–101 (no date).

Article entitled, "Density Oscillation in Sputtered Tantalum Nitride Barrier Metal Thin Films", by Yanjun Ma et al., Conference Proceedings ULSI XIV—1999 Materials Research Society, pp. 357–363.

Article entitled, "Ta–N as a Cu Diffusion Barrier in Metallization Structures", by J. Mendonca et al., in Conference Proceedings ULSI XIII—1998 Materials Research Society, pp. 741–745.

Article entitled, "PVD Ta and TaN, Diffusion Barriers and Deposition Techniques for Copper Metallization", by B. Sun et al., in Conference Proceedings USLI XIII—1998 Materials Research Society, pp. 137–141.

Article entitled, "Process Development and Integration of PVD Ta–Si–N Films for Copper Interconnect Applications", by R. Venkatraman, in Conference Proceedings ULSI XIII—1998 Materials Research Society, pp. 63–69.

(List continued on next page.)

Primary Examiner—John F. Niebling
Assistant Examiner—Lynne Gurley
(74) Attorney, Agent, or Firm—Mathew D. Rabdau; David C. Ripma; Scott C. Krieger

(57) ABSTRACT

A method of forming conducting diffusion barriers is provided. The method produces substantially amorphous conducting diffusion barriers by depositing materials with varying ratios of elements throughout the diffusion barrier. Diffusion barriers of metal nitride, metal silicon nitride, are deposited using CVD, PECVD, or ALCVD, by depositing material with a first ratio of elements and then depositing substantially identical material with a different ratio of elements. The actual elements used are the same, but the ratio is changed. By changing the ratio of the elements within the same diffusion barrier, density variations are produced, and the material is not able to form undesirable polycrystalline structures.

16 Claims, 3 Drawing Sheets

OTHER PUBLICATIONS

Article entitled, "The Use of Tantalum as Contact and Barrier Material from the Silicon Active Regions to the Bond Pads in Copper Metallization Scheme", by Christian Wenzel et al., in Conference Proceedings ULSI XIII—1998 Materials Research Society, pp. 131–137.

Article entitled, "Barriers for copper interconnections", by Changsup Ryu et al., published in Apr. 1999 Solid State Technology, pp. 53–56.

Article entitled, "Depositing Diffusion Barriers", by John Baliga, in Mar. 1997 Semiconductor International, pp. 77–82.

* cited by examiner

METHOD OF FORMING AMORPHOUS CONDUCTING DIFFUSION BARRIERS

BACKGROUND OF THE INVENTION

This invention relates generally to semiconductor technology and more particularly to a method of forming conducting diffusion barriers for semiconductor devices.

Diffusion barriers are commonly used in integrated circuit (IC) fabrication to prevent interdiffusion of metals. For example, a TiN film is used to prevent diffusion of Al into Si at contact regions and along metal lines. As the dimensions of ICs, particularly contact regions and metal lines, continue to shrink, the requirements for the conducting barrier also become more stringent. Thinner barriers are required without substantially increasing resistivity. Barriers also need to be more resistant to diffusion of various new metals, which are being introduced into production processes. One of the metals that is being introduced is copper. Although few diffusion barriers materials effectively block the diffusion of copper, metal nitride and silicon nitride have been shown to act as good barriers against copper diffusion.

To produce effective conductive diffusion barriers, the barriers should preferably act to prevent the diffusion of metals into adjacent structures while simultaneously acting as adequate conductors. The conductive diffusion barrier should provide a suitable balance between its diffusion barrier properties and its conductive properties.

It would be advantageous if a conductive diffusion barrier were available that acted as a good barrier against copper, or other metal, while acting as an adequate conductor.

It would be advantageous if a method of forming a diffusion barrier with the desired characteristics could be provided.

SUMMARY OF THE INVENTION

Accordingly, a method is provided to produce a conducting diffusion barrier that is substantially amorphous, so that no boundary regions extend through the layer to allow for diffusion of metals through the barrier. The method of the present invention comprises the steps of preparing a semiconductor substrate, or wafer, and then forming a barrier layer overlying the semiconductor substrate by depositing a material comprising a refractory metal and nitrogen having a first ratio of elements, and then depositing the same material having a second ratio of elements. The material is considered to be the same material if it has the same basic desired elements, even though the ratio of those elements varies. In another preferred embodiment, the material comprises a refractory metal, silicon, and nitrogen. Preferably, the refractory metal is selected from the group consisting of titanium (Ti), tantalum (Ta) or tungsten (W).

The semiconductor substrate is prepared and placed within a deposition chamber. The deposition chamber is either a chemical vapor deposition (CVD) chamber, a plasma enhanced chemical vapor deposition (PECVD) chamber, or an atomic layer chemical vapor deposition (ALCVD) chamber. A metal nitride precursor is introduced into the chamber along with a nitrogen precursor. The nitrogen precursor can be varied relative to the metal nitride precursor to vary the overall ratio of metal to nitrogen within the diffusion barrier material. As layers of material are deposited the amount of nitrogen precursor is changed to deposit different ratios of elements. The varying ratios of elements throughout the diffusion barrier produces an amorphous diffusion barrier with varying densities through out the barrier. The amorphous structures prevents boundary regions that might otherwise provide a diffusion path for copper or other metals.

Following the deposition process, the diffusion barrier material is annealed, and a layer of metal is deposited to form a conductive path on the semiconductor substrate.

DETAILED DESCRIPTION OF THE INVENTION

Figure 1:
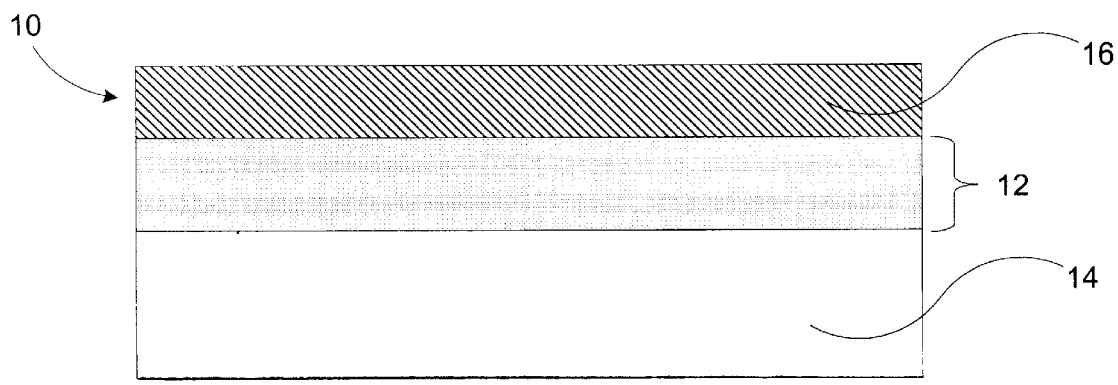
FIG. 1 is a schematic cross-sectional view showing a conducting diffusion barrier.

Referring now to the drawings, which are for illustration purposes (not to scale), FIG. 1 illustrates a semiconductor device structure 10 produced by the method of the present invention. Semiconductor device structure 10 comprises a conductive diffusion barrier layer 12 interposed between a semiconductor substrate 14 and a metal layer 16. The conductive diffusion barrier layer 12 reduces, or eliminates, diffusion of metal from metal layer 16 into semiconductor substrate 14, while allowing electrical current to pass from metal layer 16 to semiconductor substrate 14.

Figure 2:
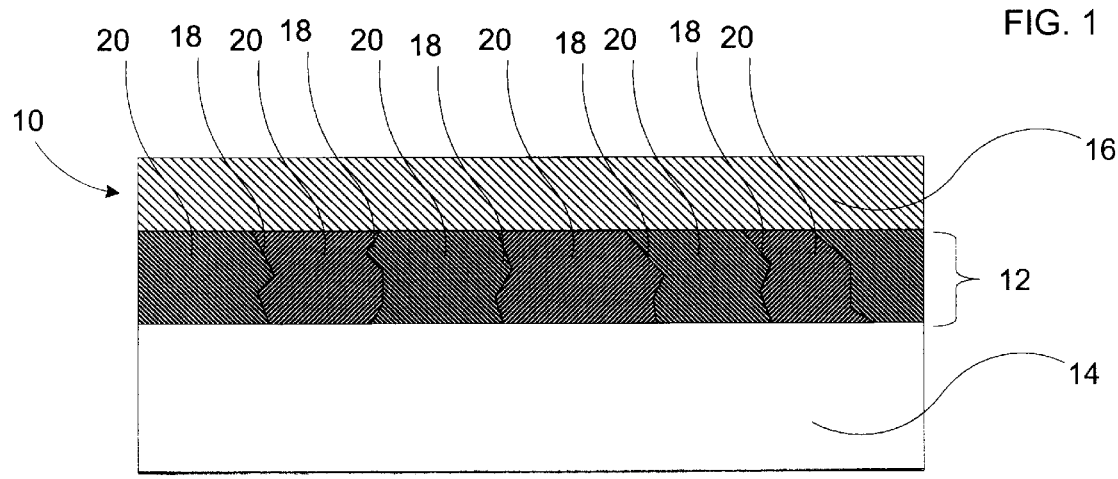
FIG. 2 is a schematic cross-sectional view showing a prior art conducting diffusion barrier.

Since diffusion barrier layer 12 carries current, it is preferably conductive. However, since diffusion barrier layer 12 is not as conductive as metal layer 16, barrier layer 12 should be as thin as possible while continuing to prevent diffusion of metal into semiconductor substrate 14. The challenges of forming adequate diffusion barriers are even greater for copper, because copper diffuses more readily than aluminum through most materials. Conventional diffusion barrier materials include polycrystalline materials such as titanium nitride (TiN), and tantalum nitride (TaN). However, copper is able to diffuse along barrier grain boundaries. As shown in FIG. 2 (prior art), the polycrystalline material forms boundaries 18 where two adjacent crystalline structures 20 meet. Copper is able to pass along boundaries 18 and diffuse into underlying structures.

Figure 3:
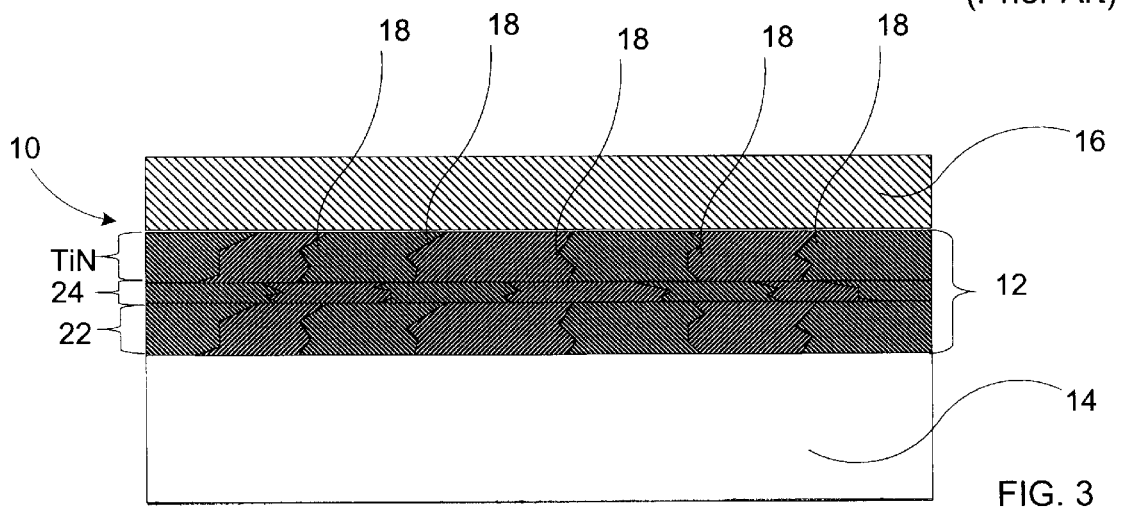
FIG. 3 is a schematic cross-sectional view showing a prior art conducting diffusion barrier.

FIG. 3 (prior art) illustrates one proposed solution to this problem. Diffusion barrier layer 12 is composed of multiple layers of different materials. For example a first sub-layer 22 is titanium nitride (TiN) and a second sub-layer 24 is titanium oxynitride (TiON). Titanium nitride is a better electrical conductor than TiON, but TiON is supposedly a better diffusion barrier. A compromise is reached by providing thin sub-layers of TiON between layers of TiN. The polycrystalline TiN still has grain boundaries 18 which will allow copper to diffuse through to the TiON layer. According to this solution, the TiON layer will provide an improved barrier layer, because there is no continuous grain boundary extending through to substrate 14. Even if grain boundaries are present within the TiON layer, there will generally not be continuous grain boundaries through multiple layers. This solution provides a compromise between the electrical properties of the conductive diffusion barrier and the diffusion barrier properties.

Referring again to FIG. 1, in the device manufactured according to the method of the present invention, diffusion barrier layer 12 is composed entirely of a single material, either a refractory metal nitride, or a refractory metal silicon nitride. To overcome the problems associated with grain boundaries mentioned above, diffusion barrier layer 12 is amorphous. Since diffusion barrier layer 12 is not polycrystalline, there are no grain boundaries extending through the layer.

Also, since lower resistivity oxynitride layers, such as TiON, are not present, the overall resistivity is lower than a multilayer diffusion barrier, such as TiN/TiON/TiN.

Figure 4:
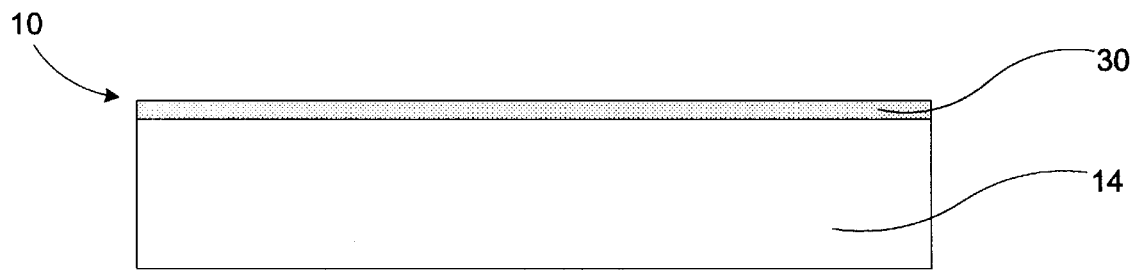
FIG. 4 is a schematic cross-sectional view showing an intermediate step in formation a conducting diffusion barrier.
Figure 5:
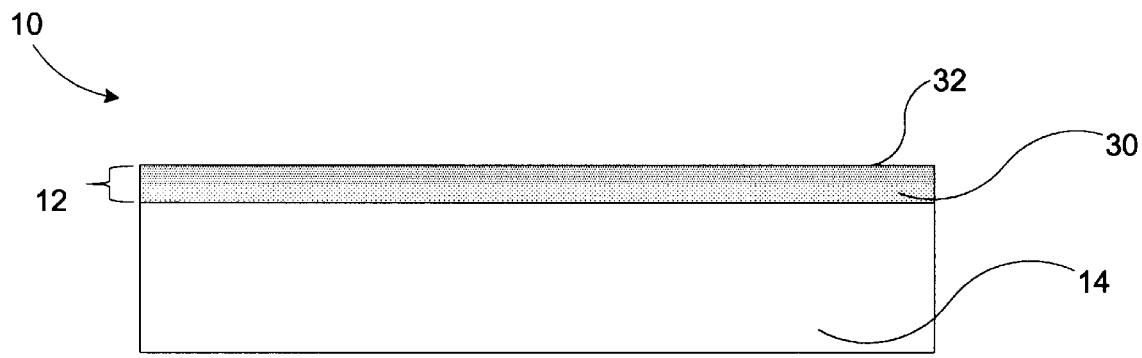
FIG. 5 is a schematic cross-sectional view showing an intermediate step in the formation a conducting diffusion barrier.
Figure 6:
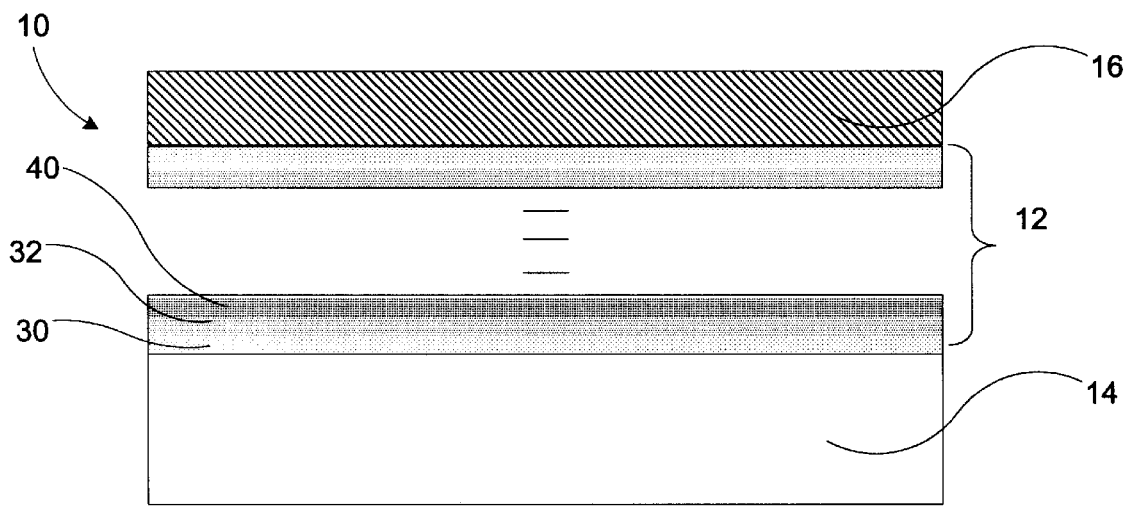
FIG. 6 is a schematic cross-sectional view illustrating that multiple density regions may be formed within the conducting diffusion barrier.

FIGS. 4–6 illustrate the formation of a diffusion barrier by the method of the present invention. Semiconductor substrate 14 is prepared. For simplicity, substrate 14 is shown as a simple flat structure. The method of the present invention may be applied to more complicated structures as well. A simple contact opening to provide electrical contact to a device could be formed using the present method. In addition, multilayer interconnects and vias could be produced by the present method. One of ordinary skill in the art will be able to apply the teachings of this method to a variety of device structures as appropriate.

As shown in FIG. 4, after substrate 14 is prepared, a diffusion barrier material 30 is deposited. Diffusion barrier material 30 is preferably a refractory metal nitride or a refractory metal silicon nitride. Diffusion barrier material 30 is preferably between 5 and 20 angstroms thick.

Diffusion barrier material 30 is preferably deposited by chemical vapor deposition (CVD). Plasma enhanced chemical vapor deposition (PECVD) could also be used to deposit diffusion barrier 30. When depositing an extremely thin amount of diffusion barrier material 30, atomic layer chemical vapor deposition (ALCVD) is preferable.

Diffusion barrier material 30 is preferably a refractory metal nitride (MN), where M stands for refractory metal, such as, titanium (Ti), tantalum (Ta) or tungsten (W). Diffusion barrier material 30 can be deposited by selecting the appropriate precursor to produce a material with a ratio of refractory metal to nitrogen ($M_aN_b$).

As shown in FIG. 5, after depositing diffusion barrier material 30, additional diffusion barrier material 32 is deposited, preferably by the same deposition method as that used to deposit diffusion barrier material 30. For example, if CVD is used to deposit diffusion barrier material 30, CVD is used to deposit additional diffusion barrier material 32. Additional diffusion barrier material 32 is the same material as diffusion barrier material 30, but with a different ratio of refractory metal to nitrogen ($M_xN_y$). Diffusion barrier material 30 and additional diffusion barrier material 32 are considered to be the same material, if the refractory metal (M) is the same for both. For instance, if the refractory metal (M) is titanium (Ti), diffusion barrier material 30 is $Ti_aN_b$ and additional diffusion barrier material 32 is $Ti_xN_y$, where the ratio a:b is not equal to the ratio x:y.

By depositing small amounts of the same material in successive steps with different ratios of elements, each thin region remains substantially amorphous throughout the conductive diffusion barrier layer 12. The varying ratio of elements prevents the formation of polycrystalline structures with boundary layers that would otherwise provide a diffusion path through the entire conductive diffusion barrier layer 12. As the amount of nitrogen, for example, varies throughout the conductive diffulsion barrier layer 12, the density also varies. This varying density is believed to reduce diffusion of copper, or other metals, through the material by maintaining the substantially amorphous nature of the conductive diffusion barrier layer. Substantially amorphous means that although microcrytallites may form within conductive diffusion barrier layer 12, no crystalline structure extends through the entire layer, and the majority of the material is amorphous.

Although refractory metal nitrides (MN) are preferred, the method of the present invention is also used to form refractory metal silicon nitride (MSiN) diffusion barriers. As discussed above, the refractory metal can be titanium, tantalum, or tungsten. If diffusion barrier material 30 is $Ti_aSi_b N_c$, then additional diffusion barrier material 32 is $Ti_xSi_yN_z$, where the proportion of elements is different so that a:b:c does not equal x:y:z.

As illustrated by FIG. 6 diffusion barrier material 30 and additional diffusion barrier material 32 could be alternately deposited many times. The deposition process could be repeated to provide between 2 and 20 different density regions. Preferably, between 4 and 5 regions will be formed, $Ti_aN_b/Ti_xN_y/Ti_aN_b/Ti_xN_y$. The overall thickness of conductive diffusion barrier 12 is preferably between 20 and 200 angstroms. Also, it is within the scope of the present invention to form one or more additional regions 40 with a different ratio of elements than diffusion barrier material 30 or additional diffusion barrier material 32.

The diffusion barrier layer is annealed to condition it and to achieve the appropriate composition. Conventional heat treatment or rapid thermal annealing processes are used to anneal conductive diffusion barrier layer 12.

Figure 7:
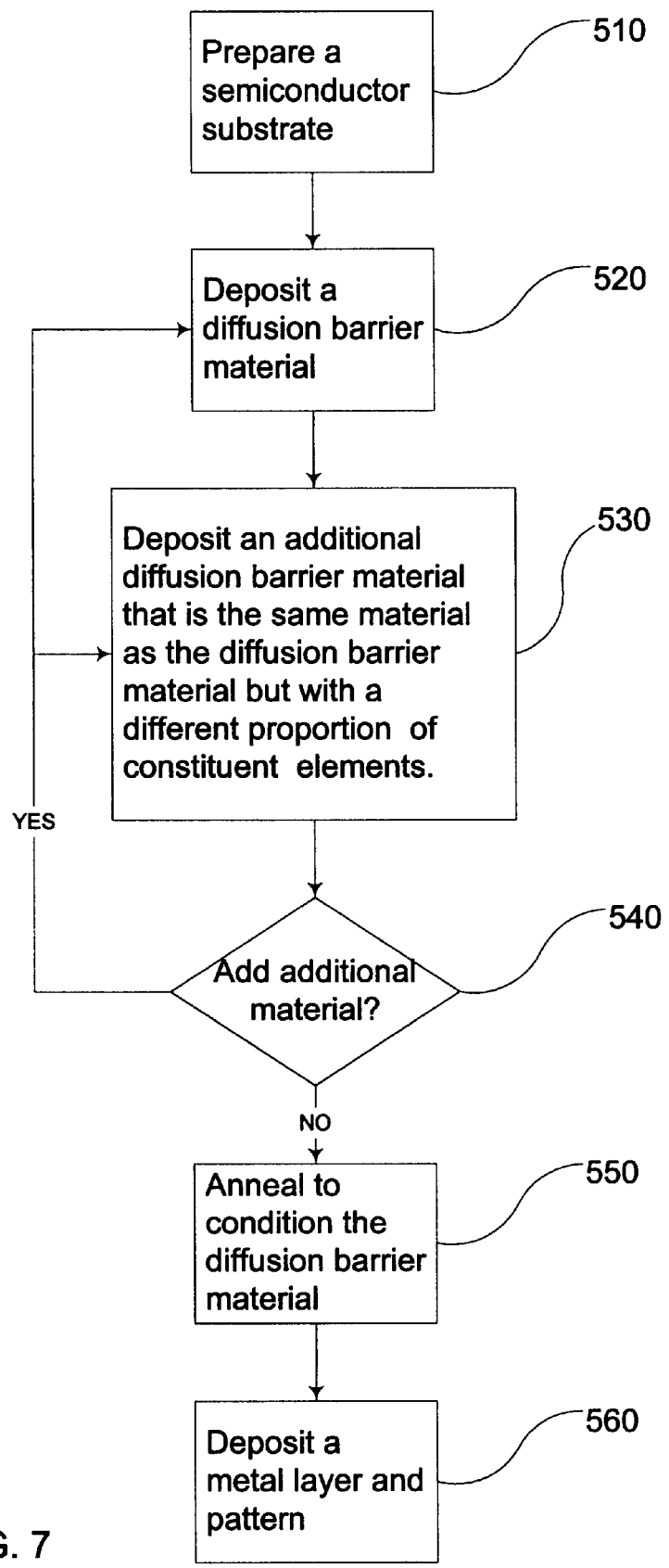
FIG. 7 is a flow diagram illustrating the steps of the method of the present invention.

The steps in the method of the present invention are illustrated schematically in FIG. 7. The first step 510 is to prepare a semiconductor substrate. The semiconductor substrate will have a trench, or contact, open to the underlying device, or multiple metal layers and interconnects, or vias as necessary to provide connections across a final device after processing.

Step 520 is depositing diffusion barrier material 30 (see FIGS. 4–6) to a thickness of less than 50 Å. Diffusion barrier material 30 is preferably TiN, TaN, WN, TiSiN, TaSiN, WSIN. In a preferred embodiment, the initial material will be between approximately 5 Å and 20 Å, but preferably 10 Å.

In a preferred embodiment of the present invention, chemical vapor deposition (CVD) is used to deposit the initial material. Preferably, low temperature CVD. For example to form a layer of Ti—N, a precursor of Tetrakis (DiMethylAmino)Titanium ($Ti(N(CH_3)_2)_4$), also referred to as TDMAT, would be used. The substrate would be exposed to the precursor at a temperature of between 350 and 450 degrees Celsius. Tetrakis(DiEthylAmino)Titanium ($Ti(N(C_2H_5)_2)_4$), also referred to as TDEAT, or Tetrakis(Ethyl Methyl Amino)Titanium, also referred to as TEMAT, are also used as precursors for forming Ti—N. The ratio of Ti to N would be approximately 1:1. To produce a material with a different desired ratio of Ti:N, an additional precursor for nitrogen is added. Preferably, the nitrogen precursor is ammonia ($NH_3$), dimethyl amine ($N(CH_3)_2$), or diethyl amine ($N(C_2H_5)_2$). When introducing a nitrogen precursor, the nitrogen precursor should be selected so that it will not result in undesirable gas phase reactions. For example, ammonia should not be used in connection with TDMAT as it will produce a gas phase reaction that will result in Ti:N being formed within the gas, prior to depositing on the wafer. Preferably, the desired reactions will occur at an upper surface of the wafer depositing the desired material. The amount of nitrogen precursor can be varied to produce ratios of Ti:N of between approximately 1.5:1 and 0.8:1.

The TiN precursor is introduced by using a carrier gas to carry vaporized precursor material into a deposition chamber. The nitrogen precursor is also introduced into the chamber. Preferably, between 100 and 200 sccm of an inert carrier gas, such as argon, is used to carry the TiN precursor. The nitrogen precursor is introduced at between 0 and 50 sccm to vary the relative amount of nitrogen within the conducting diffusion barrier.

To deposit TiSiN, silane can be introduced between depositions of TiN. The amount of silicon within the final material can be controlled by controlling the amount and duration of silane exposure.

Although the above description relates to TiN and TiSiN materials, the process can also be applied to form TaN, WN, TiSiN, TaSiN, WSiN by selecting appropriate precursors and varying the nitrogen.

Step 530 is depositing an additional diffusion barrier material that is the same material as the diffusion barrier material but with a different proportion of constituent elements. The process is preferably the same process as that described above in connection with step 520, with a different amount of nitrogen precursor. Once the desired thickness of diffusion barrier material 30 (see FIGS. 4–6) is deposited, additional diffusion material 32 (see FIGS. 4–6) can be formed by depositing one or more regions of additional diffusion barrier material 32.

Step 540 provides for the repetition of steps 520 and 530 until the desired number of regions are deposited and the desired overall thickness is achieved. Although steps 520, 530 and 540 are described as separate, distinct steps, it is also within the scope of the present invention to vary the nitrogen precursor in a continuous manner while continuing to deposit the TiN material.

Step 550 is the annealing of the conductive diffusion barrier layer. The wafer, including the conductive diffusion barrier layer, is heat treated using a furnace or a rapid thermal anneal process to condition the conductive diffusion barrier layer. Preferably, the wafer is annealed at a temperature of between approximately 350 degrees Celsius and 500 degress Celsius for approximately 1 to 60 minutes.

Step 560 is the deposition of a metal film and subsequent processing according to any state of the art methods. The metal film is aluminum, copper, silver, gold or any other desired metal.

In addition to CVD processing, it is also possible to practice the method using a PECVD process or an ALCVD process.

Although the illustrations show application of the present invention to a relatively simple structure, the present invention is also well suited to the formation of more complicated structures, including trenches, multiple conductive layers, and vias.

Alternative embodiments are possible within the scope of the present invention. As is clear from the illustrative examples, the invention can be practiced using a variety of materials, and deposition techniques. Other variations of the method within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of forming a conductive diffusion barrier comprising the steps of:
    a) preparing a semiconductor substrate;
    b) forming a barrier layer overlying the semiconductor substrate by using chemical vapor deposition (CVD) to deposit a refractory metal (M) nitride (N) having a first ratio of refractory metal to nitrogen $M_aN_b$, and then using CVD to deposit the same refractory metal nitride having a second ratio of refractory metal to nitrogen $M_xN_y$ and
    c) depositing a metal layer overlying the barrier layer.

2. The method as in claim 1, wherein step (b) is repeated a plurality of times.

3. The method as in claim 1, wherein the chemical vapor deposition (CVD) process is a plasma enhanced chemical vapor deposition (PECVD) process.

4. The method as in claim 1, wherein the chemical vapor deposition (CVD) process is an atomic layer chemical vapor deposition (ALCVD) process.

5. The method as in claim 1, wherein the refractory metal (M) is selected from the group consisting of Ti, Ta, and W.

6. The method as in claim 1, wherein the metal layer is a layer of metal selected from the group consisting of Al, Cu, Ag, and Au.

7. A method of forming a conductive diffusion barrier comprising the steps of:
    a) preparing a semiconductor substrate;
    b) forming a barrier layer overlying the semiconductor substrate by using chemical vapor deposition (CVD) to deposit a refractory metal (M) silicon (Si) nitride (N) having a first ratio of refractory metal to silicon to nitrogen $M_aSi_bN_c$, and then using CVD to deposit the same refractory metal silicon nitride having a second ratio of refractory metal to nitrogen $M_xSi_yN_z$, and
    c) depositing a metal layer overlying the barrier layer.

8. The method as in claim 7, wherein the chemical vapor deposition (CVD) process is a plasma enhanced chemical vapor deposition (PECVD) process.

9. The method as in claim 7, wherein the chemical vapor deposition (CVD) process is an atomic layer chemical vapor deposition (ALCVD) process.

10. The method as in claim 7, wherein the refractory metal (M) is selected from the group consisting of Ti, Ta, and W.

11. The method as in claim 7, wherein the metal layer is a layer of metal selected from the group consisting of Al, Cu, Ag, and Au.

12. A method of forming a conductive diffusion barrier comprising the steps of:
    a) preparing a semiconductor substrate;
    b) placing the semiconductor substrate within a chemical vapor deposition (CVI) chamber;
    c) introducing a TiN precursor and a nitrogen precursor into the chamber, wherein the nitrogen precursor is introduced at a first nitrogen precursor flow rate, whereby a TiN material is deposited having a first ratio of elements;
    d) introducing a TiN precursor and a nitrogen precursor into the chamber, wherein the nitrogen precursor is introduced at a second nitrogen precursor flow rate, whereby a TiN material is deposited having a second ratio of elements;
    e) annealing the material; and
    f) depositing a layer of metal overlying the material.

13. The method of claim 12, wherein steps (c) and (d) are repeated as necessary to form a substantial amorphous conducting diffusion barrier of a desired thickness.

14. The method of claim 12, wherein the TiN precursor is Tetrakis(DiMethylAmino)Titanium ($Ti(N(CH_3)_2)_4$) (TDMAT), Tetrakis(DiEthylAmino)Titanium ($Ti(N(C_2H_5)_2)_4$) (TDEAT), or Tetrakis(Ethyl Methyl Amino) Titanium (TEMAT).

15. The method of claim 12, wherein the nitrogen precursor is ammonia ($NH_3$), dimethyl amine ($N(CH_3)_2$), or diethyl amine ($N(C_2H_5)_2$).

16. The method of claim 15, wherein the nitrogen precursor is introduced into the CVD chamber at a rate of between 0 and 50 sccm.

* * * * *